(12) United States Patent
Roh

(10) Patent No.: US 9,780,282 B2
(45) Date of Patent: Oct. 3, 2017

(54) THERMOELECTRIC MODULE AND HEAT CONVERSION DEVICE USING THE SAME

(71) Applicant: LG INNOTEK CO., LTD., Seoul (KR)

(72) Inventor: Myoung Lae Roh, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 248 days.

(21) Appl. No.: 14/591,226

(22) Filed: Jan. 7, 2015

(65) Prior Publication Data

US 2015/0194589 A1    Jul. 9, 2015

(30) Foreign Application Priority Data

Jan. 8, 2014  (KR) .................. 10-2014-0002440

(51) Int. Cl.
*H01L 35/34* (2006.01)
*H01L 35/32* (2006.01)

(52) U.S. Cl.
CPC ................... *H01L 35/32* (2013.01)

(58) Field of Classification Search
CPC ........................................ H01L 35/32
USPC ........................................ 136/200
See application file for complete search history.

(56) References Cited

U.S. PATENT DOCUMENTS

| 6,252,154 B1* | 6/2001 | Kamada .................. H01L 35/32 136/201 |
| 2008/0245398 A1* | 10/2008 | Bell ........................ F02G 1/043 136/224 |
| 2012/0049315 A1 | 3/2012 | Kim et al. |
| 2013/0263906 A1 | 10/2013 | Maeshima et al. |
| 2014/0190543 A1* | 7/2014 | Chen ..................... H01L 35/325 136/224 |

FOREIGN PATENT DOCUMENTS

| JP | H10-144967 A | 5/1998 |
| JP | 2001-007411 A | 1/2001 |
| JP | 2005-093532 A | 4/2005 |
| JP | 2009-164498 A | 7/2009 |
| WO | WO 2012/056411 A1 | 5/2012 |

OTHER PUBLICATIONS

Extended European Search Report dated Jul. 3, 2015 issued in Application No. 15150326.5.

* cited by examiner

*Primary Examiner* — Jayne Mershon
(74) *Attorney, Agent, or Firm* — KED & Associates LLP

(57) ABSTRACT

Provided is a thermoelectric module capable of preventing the leakage of a current generated from a connection portion upon connecting a thermoelectric semiconductor element to an electrode by forming an insulating layer having a low heat conductivity on an external surface of the thermoelectric semiconductor element and improving performance of the thermoelectric element by controlling a heat transfer phenomenon from a heating part to a cooling part.

18 Claims, 5 Drawing Sheets

FIG. 4
| NO | INSULATING MEMBER | THERMOELECTRIC PERFORMANCE (delta T [°C]) |
|---|---|---|
| 1 | SiNx | 55.6 |
| 2 | SiNx | 58.8 |
| 3 | SiOx | 59 |
| 4 | Mixture of SiO, MgO, and CaO | 60.7 |
FIG. 5
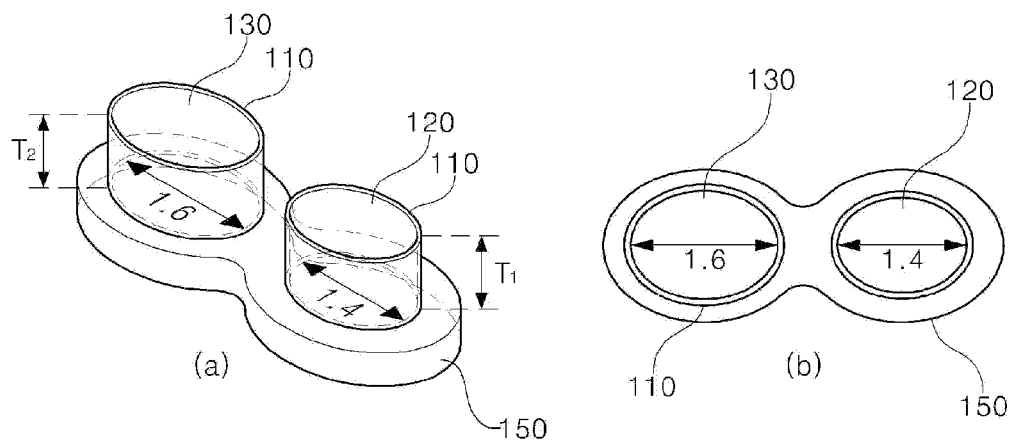
FIG. 6
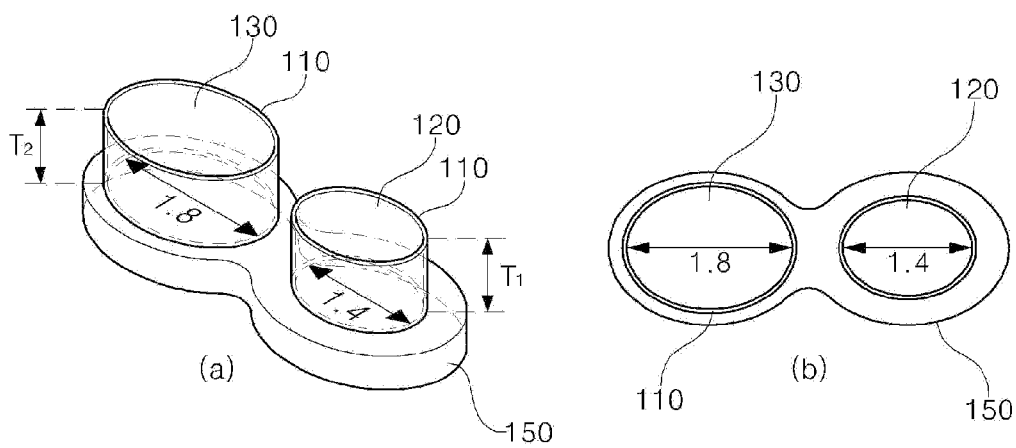

THERMOELECTRIC MODULE AND HEAT CONVERSION DEVICE USING THE SAME

CROSS-REFERENCE TO RELATED APPLICATION

This application claims priority under 35 U.S.C. §119 to Korean Application No. 10-2014-0002440 filed on Jan. 8, 2014, in the Korean Intellectual Property Office, whose entire disclosure is hereby incorporated by reference.

BACKGROUND

1. Field

Embodiments of the present disclosure relate to a thermoelectric module.

2. Background

A thermoelectric element is manufactured by thermally treating a material in an ingot form, pulverizing the material into powder using a ball milling process, performing a sintering process after sieving the powder in a minute size, and then cutting the sintered powder in a size required for a thermoelectric element. In the process for producing such a bulk type thermoelectric element, many losses of the material are generated upon performing the cutting process after sintering the powder. In the case of mass production of the thermoelectric element, since uniformity is reduced in light of a size of the bulk type material and it is difficult to produce a thickness of the thermoelectric element thinly, it is problematic in that it is difficult to apply the thermoelectric element to a product for which a slim structure is required.

In particular, when a thermoelectric element is driven in a state of being connected to between the substrates, a heat transfer phenomenon from a heating part to a cooling part is generated, thereby causing the reduction of a cooling ability of the thermoelectric element. Moreover, a leakage current is generated along the connection material (solder) of a connection portion between the thermoelectric elements and the substrates, thereby serving a factor that reduces thermoelectric efficiency.

BRIEF DESCRIPTION OF THE DRAWINGS

The embodiments will be described in detail with reference to the following drawings in which like reference numerals refer to like elements wherein:

FIG. 4 shows the comparison of thermoelectric performances ΔT resulting from the presence or absence of various insulating members with forming the insulating members in the structure of a first semiconductor element 120 and a second semiconductor element 130 as shown in FIG. 3;

FIGS. 5 to 7 are conceptual views illustrating each structure of unit cells according to a second embodiment of the present disclosure.

DETAILED DESCRIPTION

Figure 1:
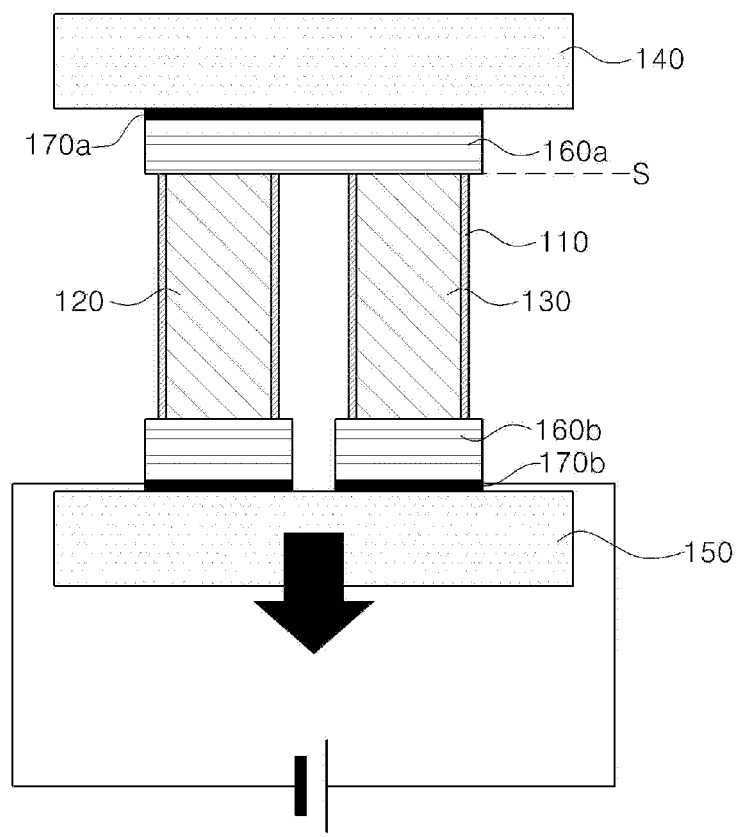
FIG. 1 is a conceptual view illustrating the subject matter of a thermoelectric module according to a first embodiment of the present disclosure.

Hereinafter, the configurations and operations according to embodiments of the present disclosure will be described in detail with reference to the accompanying drawings. The present disclosure may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms are only used for the purpose for distinguishing a constitutive element from other constitutive element.

1. First Embodiment

Figure 2:
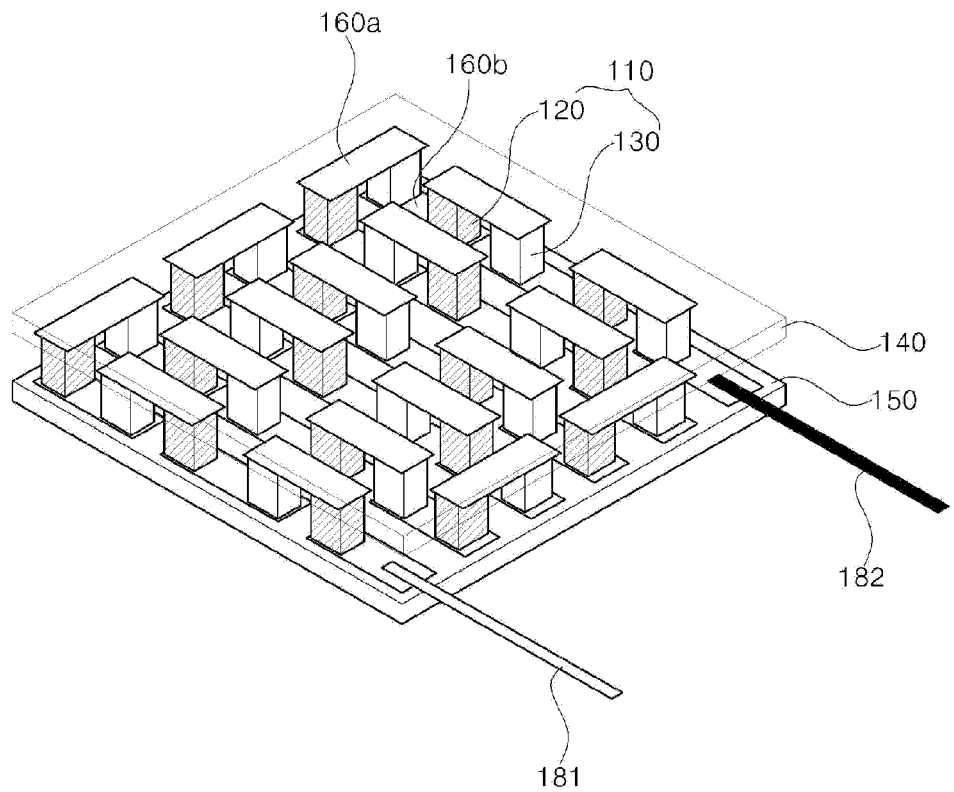
FIG. 2 is an exemplary view illustrating an embodied example of the thermoelectric module according to the first embodiment of the present disclosure.

FIG. 1 is a conceptual view illustrating the subject matter of a thermoelectric module according to a first embodiment of the present disclosure, and FIG. 2 is an exemplary view illustrating an embodied example of the thermoelectric module according to the present embodiment of the disclosure to which the thermoelectric module of FIG. 1 is applied.

Referring to FIGS. 1 and 2, a thermoelectric module according to the present embodiment of the disclosure may include: a first substrate 140 and a second substrate 150 facing each other; at least one unit cell including a second semiconductor element 130 and a first semiconductor element 120 electrically connected to each other between the first substrate 140 and the second substrate 150. In particular, the thermoelectric module may further include an insulating member 110 formed on an external surface of each of the first semiconductor element and the second semiconductor element. As illustrated in FIGS. 1 and 2, the insulating member 110 may be formed to be closely attached to the first and second semiconductor elements in such a manner as to surround the respective external surfaces. Thanks to the insulating member 110, thermoelectric efficiency may be increased because heat transfer from a heating part to a heat absorption part is controlled, and a leakage current generated from a solder and the like of a connection portion of the first and second substrates 140, 150 and the semiconductor elements may be controlled. According to the present embodiment of the disclosure, the insulating member 110 may be disposed on the external surface of the first semiconductor element or the second semiconductor element and may have lower thermal conductivity than that of the first semiconductor element or the second semiconductor element. In this case, the control efficiency of heat transfer may be further increased.

Also, as illustrated in FIGS. 1 and 2, the insulating member 110 may be formed to entirely surround the respective external sides of the first semiconductor element and the second semiconductor element. Unlike this, the insulating member may be only formed in any one of the first semiconductor element and the second semiconductor element. Moreover, the insulating members disposed on the respective surfaces of the first semiconductor element and the second semiconductor element may be made of different materials, respectively.

Also, when the insulating member 110 is formed to surround the respective external surfaces of the first semiconductor element and the second semiconductor element, the insulating member may be implemented to cover a connection portion S between the first and second substrates and the first and second semiconductor elements.

As illustrated in FIGS. 1 and 2, the thermoelectric module according to the present embodiment of the disclosure may be composed of a P type semiconductor corresponding to the first semiconductor element 120 and an N type semiconductor corresponding to the second semiconductor element 130. The first semiconductor element and the second semiconductor element are connected to metal electrodes 160a, 160b, respectively. Such a structure is formed in plural number. A peltier effect is implemented by circuit lines 181, 182 for supplying currents to the semiconductor elements via electrodes.

Specifically, in the case of a cooling thermoelectric module, a general insulating substrate such as an alumina substrate may be used as the first substrate 140 and the second substrate 150. Also, in the case of the present embodiment of the disclosure, a metal substrate may be used as the first and second substrates so that heat dissipation efficiency and a slimming structure can be implemented. Of course, when the first and second substrates are formed with the metal substrate, as illustrated in FIG. 1, dielectric layers 170a, 170b may be further included between electrode layers 160a, 160b on which the first substrate 140 and the second substrate 150 are formed.

In the case of the metal substrate, Cu or a Cu alloy, a Cu—Al alloy and the like may be applied. For a slimming structure, a thickness of the metal substrate may range from 0.1 to 0.5 mm. In this case, when the thickness of the metal substrate is thinner than 0.1 mm or is larger than 0.5 mm, an excessively high heat dissipation property or thermal conductivity is generated, so reliability of the thermoelectric module is largely reduced.

Also, the dielectric layers 170a, 170b are made of a dielectric material having high heat dissipation performance. In consideration of heat conductivity of the cooling thermoelectric module, the dielectric layer may be formed using a material having a heat conductivity of 5~10 W/K and may have a thickness ranging from 0.01 to 0.1 mm. In this case, when the thickness is less than 0.01 mm, insulating efficiency (or a dielectric property) is largely reduced, and when the thickness is more than 0.1 mm, heat conductivity is reduced, thereby causing the reduction of heat dissipation efficiency.

The electrode layers 160a, 160b are made of an electrode material such as Cu, Ag, Ni and the like and electrically connect the first semiconductor element and the second semiconductor element. Furthermore, when illustrated multiple unit cells are connected to the electrode layers (see FIG. 2), an electrical connection with the adjacent unit cell is formed. A thickness of the electrode layer may range from 0.01 to 0.3 mm. When the thickness of the electrode layer is less than 0.01 mm, a function as an electrode is reduced, so electric conductivity is reduced. When the thickness of the electrode layer is more than 0.3 mm, resistance is increased, so electric conductivity is reduced.

Also, a diffusion prevention film (nor drawn) may be further included in an upper surface of the second semiconductor element 130 electrically connected to the first semiconductor element 120, namely, a portion where the first substrate and the second substrate are closely attached to each other.

Any one of an epoxy resin, an SiO-based material, an SiN-based material, an MgO-base material, and a CaO-based material, or a mixture of two or more materials selected from among these materials may be applied as the material of the insulating member.

In particular, in the present embodiment of the present disclosure, the insulating member 110 may be formed on the external surface of the second semiconductor element 130 electrically connected to the first semiconductor element 120. It is more preferable that the insulating member 110 be formed using a material having a lower heat conductivity than that of a material constituting the first semiconductor element 120 and the second semiconductor element 130. Any one of an epoxy resin, an SiO-based material, an SiN-based material, an MgO-based material, and a CaO-based material, or a mixture of two or more material selected from these materials may be applied as the material for forming the insulating member.

A semiconductor element formed in a bulk type with a P type semiconductor material or an N type semiconductor material may be applied as the first semiconductor element 120 and the second semiconductor element 130. The bulk type element refers to a structure formed by pulverizing an ingot corresponding to a semiconductor material by cutting a sintered structure after subjecting the ingot to a ball mill process for granulation. The bulk type element may be formed in an integral structure.

The N type semiconductor material may be formed using a main raw material composed of a BiTe-based material including Se, Ni, Al, Cu, Ag, Pb, B, Ga, Te, Bi, and In, and a mixture mixed with 0.001 to 1.0 wt % of Bi or Te with respect to a total weight of the main raw material. For example, when the main raw material is a Bi—Se—Te material, Bi or Te may be further added in an amount of 0.001 to 1.0 wt % with respect to a total weight of the Bi—Se—Te material. That is, when the Bi—Se—Te material is added in the weight of 100 g, the amount of additionally mixed Bi or Te may range from 0.001 to 1.0 g. As described above, the amount of the material added to the main raw material may range from 0.001 to 0.1 wt %, In such a range, heat conductivity is not reduced, but electric conductivity is reduced so that an increase of a ZT value cannot be expected. In light of this fact, the range has a meaning.

The P type semiconductor material may be formed using a main raw material composed of a BiTe-based material including Se, Ni, Al, Cu, Ag, Pb, B, Ga, Te, Bi, and In, and a mixture mixed with 0.001 to 1.0 wt % of Bi or Te with respect to a total weight of the main raw material. For example, when the main raw material is a Bi—Se—Te material, Bi or Te may be further added in an amount of 0.001 to 1.0 wt % with respect to a total weight of the Bi—Se—Te material. That is, when the Bi—Se—Te material is added in the weight of 100 g, the amount of additionally mixed Bi or Te may ranges from 0.001 to 1.0 g. As described above, the amount of the material added to the main raw material may range from 0.001 to 0.1 wt %. In such a range, heat conductivity is not reduced, but electric conductivity is reduced so that an increase of a ZT value cannot be expected. In light of this fact, the range has a meaning.

Figure 3:
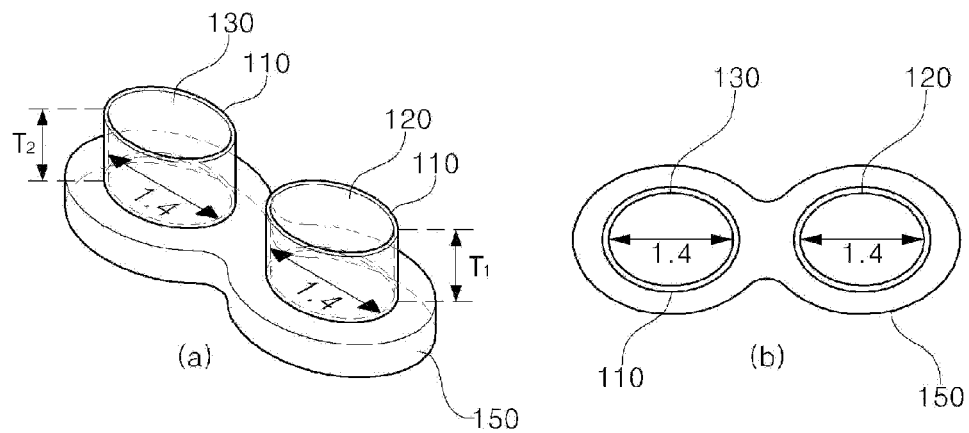
FIG. 3 is a conceptual view illustrating the structure of a unit cell of FIG. 1.

FIG. 3 illustrates one subject matter of the first semiconductor element 120 and the second semiconductor element 130 of FIGS. 1 and 2. As illustrated in FIG. 3, it shows an example in which the first semiconductor element 120 and the second semiconductor element 130 have the same size and are implemented in the structure of a circular or elliptical shape. When the first semiconductor element 120 and the second semiconductor element 130 are implemented in a circular shape, it is advantageous in that a material loss can be reduced. Furthermore, the respective external surfaces of the first semiconductor element 120 and the second semiconductor element 130 are coated with the insulating member 110 so that heat transfer can be prevented and the leakage of an electrical current can be also prevented. Any one of an epoxy resin, an SiO-based material, an SiN-based material, an MgO-base material, and a CaO-based material, or a mixture of two or more materials selected from among these materials may be applied as a material which forms the insulating member.

FIG. 4 shows the comparison of thermoelectric performances ΔT resulting from the presence or absence of various insulating members with forming the insulating members in the structure of the first semiconductor element 120 and the second semiconductor element 130 as shown in FIG. 3.

(1) Production of the First Semiconductor Element

The first semiconductor element produced through the present comparative experiment is a P type semiconductor element and has the structure of a circular section having a diameter of 1.4 mm. The production process thereof is the following.

First, under the condition of $Bi_{2-x}Sb_xTe_3$ (1.2<x<1.8), weighting of a Bi—Sb—Te based sample in a bead form was performed. Te was added in a weight exceeding 1 to 10% compared to a weight of $Bi_{2-x}Sb_xTe_3$ in consideration of a volatile property. As a dopant material upon weighting, a material such as Cu, Ag, W, Mn, Ce, Yt, Ni, Bi, Te, Se, Sb, CuI, AgI, $CdI_2$, $SbI_3$, CuBr, AgBr, $CdBr_2$, $SbBr_3$, CuCl, AgCl, $CdCl_2$, $SbCl_3$ and the like was added in an amount of 0.01~1 wt %. At this time, the dopant material may be in a bead form or in a power form of 200 μm or less. The material was putted in a melting furnace facility, and a nonvolatile atmosphere of Ar, He or $N_2$ and the like in a vacuum state was formed. The material was melted for 2 to 10 hours at the temperature of 600~800° C. and was then rapidly cooled in water or air, thereby obtaining an ingot.

The obtained ingot along with a steel ball having a weight in a 10 to 40 fold increase of a material weight was inserted into a ball mill container. The ingot was pulverized at a rotation speed of 200 to 400 rpm by forming an inactive atmosphere of Ar, He, $N_2$, or the like in the container, thereby obtaining minute dielectric powder. A particle size of the powder may range from 1 to 10 μm. When the particle size is beyond such a range, a desired size could be formed by performing sieving. For sintering, weighing of the dielectric minute powder was performed in an appropriate amount. Then, to the dielectric minute powder, 0.01~0.1 wt % (weight ratio) of a material having a size of 200 μm or less such as Cu, Ag, W, Mn, Ce, Yt, Ni, Te, Se, Sb, CuI, AgI, $CdI_2$, $SbI_3$, CuBr, AgBr, $CdBr_2$, $SbBr_3$, CuCl, AgCl, $CdCl_2$, $SbCl_3$ and the like could be added. A sintered material was formed with the powder at the atmosphere of Ar under the pressure of 35 to 200 MPa at the temperature of 400 to 550° C. using extrusion sintering equipment. Then, an extrusion sintering process was performed at the speed of 20 to 100 mm/min in the proportion of 10:1 to 30:1 at the temperature of 300~550° C.

A side of the sintered material which has been sintered in a size to be used in the element was coated with an epoxy paste, an SiO-based paste, an SiN-based paste, an MgO-based paste, or a CaO-based paste, or by forming a paste tape made of the same material, the paste tape was combined with the electrode layer. In this experimental example, the insulating member was formed with the sample as shown in the table illustrated in FIG. 4.

The second semiconductor element produced through the present comparative experiment is an N type semiconductor element and has the structure of a circular section having a diameter of 1.4 mm. The production process thereof is the following.

Under the condition of $Bi_2Te_{3-y}Se_y$ (0.1<y<0.4), weighting of a Bi—Sb—Te based sample in a bead form was performed. Te and Se were added in a weight exceeding 1 to 10% compared to a weight of $Bi_2Te_{3-y}Se_y$ in consideration of a volatile property. As a dopant material upon weighting, a material such as Cu, Ag, W, Mn, Ce, Yt, Ni, Bi, Te, Se, Sb, CuI, AgI, $CdI_2$, $SbI_3$, CuBr, AgBr, $CdBr_2$, $SbBr_3$, CuCl, AgCl, $CdCl_2$, $SbCl_3$ and the like was added in an amount of 0.01~1 wt %. At this time, the dopant material may be in a bead form or in a power form of 200 μm or less. The material was putted in a melting furnace facility, and a nonvolatile atmosphere of Ar, He or $N_2$ and the like in a vacuum state was formed. The material was melted for 2 to 10 hours at the temperature of 600~800° C. and was then rapidly cooled in water or air, thereby obtaining an ingot.

The obtained ingot along with a steel ball having a weight in a 10 to 40 fold increase of a material weight was inserted into a ball mill container. The ingot was pulverized at a rotation speed of 200 to 400 rpm by forming an inactive atmosphere of Ar, He, N2, or the like in the container, thereby obtaining minute dielectric powder. A particle size of the powder may range from 1 to 10 μm. When the particle size is beyond such a range, a desired size could be formed by performing sieving. For sintering, weighing of the dielectric minute powder was performed in an appropriate amount. Then, to the dielectric minute powder, 0.01~0.1 wt % (weight ratio) of a material having a size of 200 μm or less such as Cu, Ag, W, Mn, Ce, Yt, Ni, Te, Se, Sb, CuI, AgI, $CdI_2$, $SbI_3$, CuBr, AgBr, $CdBr_2$, $SbBr_3$, CuCl, AgCl, $CdCl_2$, $SbCl_3$ and the like could be added. A sintered material was formed with the powder at the atmosphere of Ar under the pressure of 35 to 200 MPa at the temperature of 400 to 550° C. using extrusion sintering equipment. Then, an extrusion sintering process was performed at the speed of 20 to 100 mm/min in the proportion of 10:1 to 30:1 at the temperature of 300~550° C. A side of the sintered material which has been sintered in a size to be used in the element was coated with an epoxy resin, or an SiO, SiN, MgO, or CaO-based paste, or by forming a paste tape made of the same material, the paste tape was combined with the electrode layer. In this experimental example, the insulating member was formed with the sample as shown in the table illustrated in FIG. 4.

As illustrated in FIG. 4, it was measured that a thermoelectric performance ΔT of the unit cell is 55.6° C. when there is no insulating member; with regard to a sample to which SiNx is applied, a thermoelectric performance ΔT of the unit cell is 58.8° C. when the insulating member is formed; a thermoelectric performance ΔT of the unit cell is 59° C. when the insulating member is formed of an SiOx-based material; and a thermoelectric performance ΔT of the unit cell is 60.7° C. when the insulating member is formed of a mixture of SiO, MgO, and CaO. In the case where the insulating member is formed, it could be confirmed that the thermoelectric performance ΔT of the unit cell is increased up to 5 to 10% of the thermoelectric performance shown in the case where there is no insulating member. In general, the generation of a high thermoelectric performance ΔT can lead to a lower temperature, and power efficiency corresponding to the improved thermoelectric performance ΔT can be improved. This is deemed to be intended to improve a thermoelectric performance by controlling heat convection and a power leak via the insulating member formed at the edge of the thermoelectric element because power consumption is reduced upon cooling.

2. Second Embodiment

The second embodiment of FIG. 5 is identical to the embodiment of FIGS. 1 to 3, in that the insulating member is formed on the external surface of each of the first semiconductor element and the second semiconductor element. The second embodiment is characterized in that a volume of the first semiconductor element 120 and a volume of the second semiconductor element 130 are implemented to be different from each other. That is, in the thermoelectric module having the structure illustrated in FIG. 1, the respective shapes and sizes of the first semiconductor element and the second semiconductor element facing each other while forming unit cells are formed to be identical to each other. However, in such a case, an electric conductivity property of the P type semiconductor element is different from that of the N type semiconductor element, thereby causing a reduction of cooling efficiency. Thus, in the present embodiment, a volume of one semiconductor element of the unit cells illustrated in FIG. 1 is formed to be different from that of another semiconductor element facing the one semiconductor element so that cooling performance can be improved. That is, in the structure of FIG. 1, as the structure shown in FIG. 5, a structure of the unit cells is implemented so that a volume of the first semiconductor element and a volume of the second semiconductor element are different from each other. With regard to forming the semiconductor elements of the unit cell arranged to face each other so as to have different volumes, the semiconductor elements may be formed to have a large difference in entire shapes. Also, a cross section of any one of the semiconductor elements having the same height may be formed to have a wider diameter than that of another one, the semiconductor elements having the same shape may be formed to have different heights or the cross sections thereof may be formed to have different diameters.

For example, in the second embodiment of the present disclosure, the unit cell illustrated in FIG. 3 including the thermoelectric element is configured such that the semiconductor elements having the same shape and the same diameter (1.4 mm) are disposed to make a pair. At this time, a height T2 of the second semiconductor element 130 is formed higher than a height T1 of the first semiconductor element 120 so that each volume of the semiconductor elements can be formed to be different from each other. In this case, in particular, the second semiconductor element 130 may be implemented as an N type semiconductor element. In particular, as illustrated, in one embodiment of the present disclosure, unlike the semiconductor elements in an existing bulk type, each cross section of the first semiconductor element and the second semiconductor element forms a printed thick film as a design in a cylindrical shape forming a circle so that production efficiency can be improved.

Also, like the structure illustrated in FIG. 5, as the second semiconductor element 130 is formed to have a larger diameter than that of the first semiconductor element 120, the first and second semiconductor elements have different volumes. In particular, in such a case, it is preferable to form the second semiconductor element as an N type semiconductor element. The first semiconductor element 120 is formed as a P type semiconductor element and the second semiconductor element is formed as the N type semiconductor element. In particular, when a height T2 of the second semiconductor element 130 is formed to be identical to a height T1 of the first semiconductor element 130, a cross section of the second semiconductor element is formed to have a larger diameter than that of the first semiconductor element (for example, 1.6 mm when a diameter of the first semiconductor element is 1.4 mm) so that the second semiconductor element can have a relatively larger volume than that of the first semiconductor element. That is, with regard to a method of forming a pair of semiconductor elements constituting one unit cell to have different volumes, the semiconductor elements having the same shape is formed in the same height, and the N type semiconductor element is formed to have a larger diameter than that of the P type semiconductor element so that a volume can be increased, thereby enabling the improvement of thermoelectric efficiency.

Figure 7:
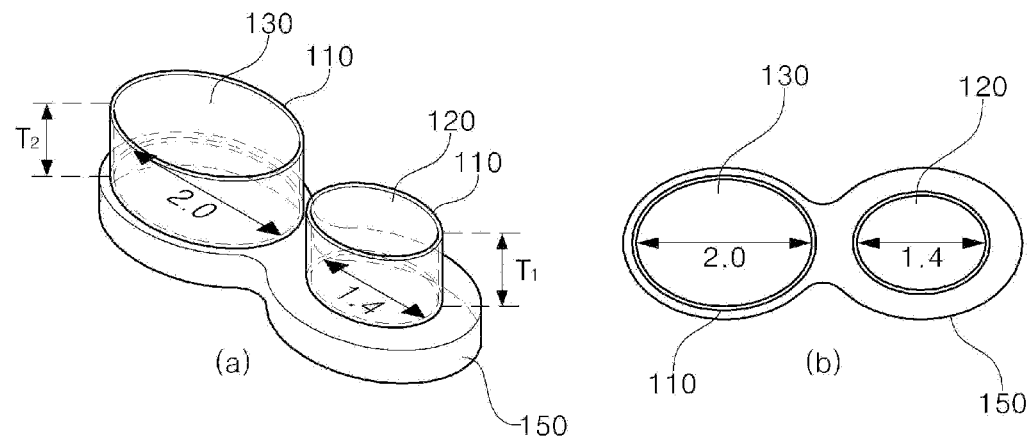

Also, the structure of FIG. 6 shows another embodiment in which the second semiconductor element 130 is formed to have a larger diameter than that of the first semiconductor element 120 so that first and second semiconductor elements can have different volumes. FIG. 6 illustrates an example in which the first semiconductor element 120 is formed to have a diameter of 1.40 mm when a diameter of the second semiconductor element 130 is 1.80 mm. FIG. 7 illustrates an example in which the first semiconductor element 120 is formed to have a diameter of 1.40 mm when a diameter of the second semiconductor element 130 is 2.0 mm. That is, in the case of FIGS. 6 and 7, the second semiconductor element and the first semiconductor element are formed to have the same height and shape (a cylindrical or elliptic cylindrical shape), and the second semiconductor element is formed to have a relatively larger diameter than that of the first semiconductor element so that they can be formed to have different volumes. In such a case, particularly, the second semiconductor element is formed as the N type semiconductor element so that an electric conductivity property can be matched with performance of the P type semiconductor element.

In the aforesaid embodiment, when the thermoelectric semiconductor elements are formed to have the same height, the rate of a radius of a horizontal cross section of the first semiconductor element to the second semiconductor element may range from 1:1.01~1.5. That is, when the cross section of the first semiconductor element formed as the P type semiconductor element has a diameter of 1.4 mm, the N type semiconductor element is formed to have a larger diameter than the diameter, namely, the N type semiconductor element may be formed to have a diameter ranging from 1.41 to 2.10 mm. In the range of 1:1.01, when the rate of the radius of the horizontal cross section of the first semiconductor element to the second semiconductor element is smaller than the range of 1.01, it is difficult to implement an effect of the improvement of electric conductivity because a change in a volume of the N type semiconductor element is so small. Meanwhile, when the rate is larger than the range of 1.5, an electric conductivity can be satisfied, but cooling performance of the thermoelectric element is slightly reduced.

3. Third Embodiment

The third embodiment has the different structure from that of each of the first embodiment and the second embodiment. The third embodiment is identical to the first and second embodiments with respect to the gist, in that the insulating member is formed on a surface of each of the first semiconductor element and the second semiconductor element, but the third embodiment is different from the first and second embodiments, in that the substrate of a thermoelectric module is formed to have a different volume from that of the first or second embodiment.

Figure 8:
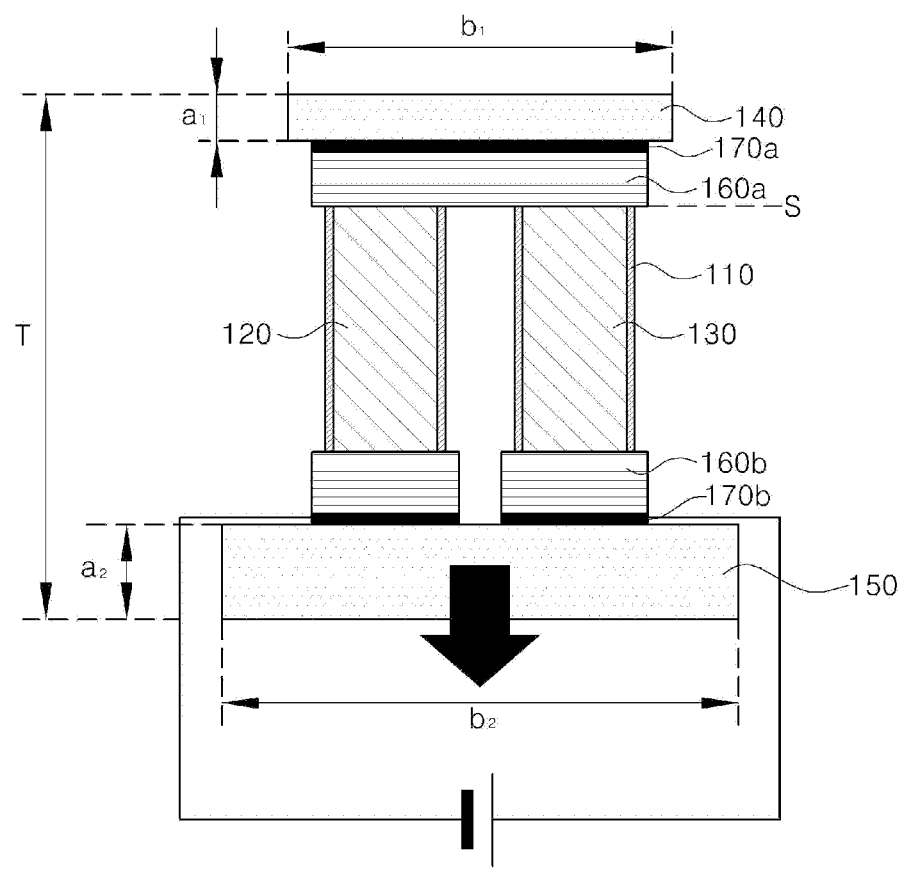
FIGS. 8 and 9 are conceptual views illustrating the structure of a unit cell according to a third embodiment of the present disclosure.
Figure 9:
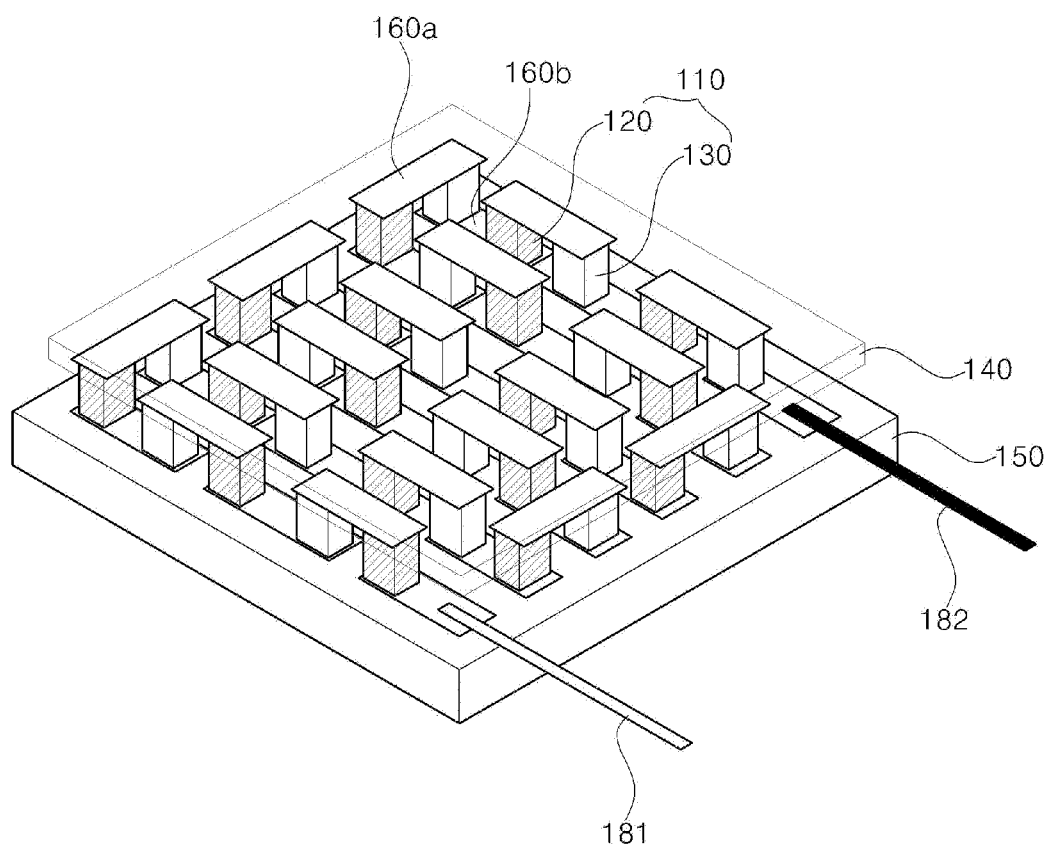

Referring to FIGS. 8 and 9, a thermoelectric module according to the third embodiment of the present disclosure includes: the first substrate 140 and the second substrate 150; at least one unit cell including the first semiconductor element 120 and the second semiconductor element 130 electrically connected to each other and arranged between the first substrate and the second substrate; and an insulating member 110 formed on an external surface of each of the first semiconductor 120 and the second semiconductor. In particular, a volume of the first substrate may be formed to be different from that of the second substrate. In the present embodiment of the disclosure, the 'volume' refers to an internal volume that forms an outer circumferential surface of the substrate. In particular, in the structure of the third embodiment of the present disclosure, based on a peltier effect, an area of the first substrate 140 constituting a cold side may be formed larger than that of the second substrate 150 constituting a hot side so that heat conductivity can be increased and radiant heat efficiency can be increased, thereby enabling the removal of a heat sink generated from the conventional thermoelectric module. Specifically, in the case of the cooling thermoelectric module, a general substrate such as an alumina substrate may be used as the first substrate 140 and the second substrate 150, or like in the present embodiment of the disclosure, a metal substrate may be used as the first and second substrates so that radiant heat efficiency and a slimming structure can be implemented. Of course, when the first and second substrates are formed with the metal substrates, dielectric layers 170a, 170b may be further included between the electrode layers 160a, 160b formed in the first substrate 140 and the second substrate 150.

In the third embodiment according to the present disclosure, the second substrate 150 is formed to have an area in a 1.2 to 5 fold increase compared to an area of the first substrate 140 so that the first and second substrates can be formed to have different volumes. As illustrated in FIG. 8, a width $b_1$ of the first substrate 140 is formed to be narrower than a width $b_2$ of the second substrate 150. In such a case, the first and second substrates having the same thickness are formed to have different areas so that the volumes of the first and second substrates can be formed to be different from each other. When the area of the second substrate 150 is formed to be less than 1.2 times compared to the area of the first substrate 140, thermoelectric efficiency has no large difference with existing thermoelectric efficiency, and accordingly, a slimming structure is nor realized. Meanwhile, when the area of the second substrate is formed to be more than 5 times compared to the area of the first substrate, it is difficult to maintain a shape of the thermoelectric module (for example, an opposed structure), and heat transfer efficiency is remarkably reduced.

Moreover, in the case of the second substrate 150, a radiant heat pattern such as an uneven pattern is formed on a surface of the second substrate so that a radiant heat property of the second substrate can be maximized. Through this, the radiant heat property can be efficiently ensured even when the element of an existing heat sink is removed. In this case, the radiant heat pattern may be formed on both surfaces of the second substrate or any one of the surfaces. In particular, when the radiant heat pattern is formed on a surface where the first and second semiconductor elements come into contact with each other, a radiant heat property and a bonding property with the thermoelectric elements and the substrates may be improved.

Also, a thickness $a_1$ of the first substrate 140 is formed thinner than a thickness $a_2$ of the second substrate 150 so that the inflow of heat generated from a cold side can be facilitated and a heat transfer rate can be increased.

The thermoelectric element having various structures according to the embodiments of the present disclosure and the thermoelectric module including the thermoelectric element may be used to implement a cooling effect by absorbing heat from a medium such as a water, a liquid or the like according to each property of a heating portion and a heat absorption portion on the surfaces of upper and lower substrates of the unit cell, to implement a heating effect by transferring heat to a specific medium. That is, in the thermoelectric module according to various embodiments of the present disclosure, even though the constitution of the cooling device having improved cooling efficiency has been described as an embodiment, as the device used for heating a medium using a heating property, the device may be applied to a substrate arranged to an opposite side in which cooling is performed. That is, the device may be implemented as one device for simultaneously enabling cooling and heating.

As set forth above, according to some embodiments of the present disclosure, the insulating layer having low heat conductivity is formed on each external surface of the thermoelectric semiconductor elements so that the leakage of a current can be prevented from being generated from a connection portion upon connecting the thermoelectric semiconductor element to an electrode, and a phenomenon of heat transfer from a heating part to a cooling part can be controlled, thereby improving performance of the thermoelectric element.

According to some embodiments of the present disclosure, in the unit cells constituting the thermoelectric semiconductor elements, a volume of any one of the semiconductor elements facing each other is formed larger than that of another one so that an electric conductivity property can be improved, thereby increasing cooling efficiency.

In particular, by changing a diameter or a height of the N type semiconductor element, the N type semiconductor element has a large volume compared to that of the P type semiconductor element constituting the unit cells so that thermoelectric cooling efficiency can be improved. In addition, a cross section of the thermoelectric element is formed in a circular or elliptical shape having a curvature so that a printed thick film can be formed, thereby enabling an increase of efficiency in production process.

According to some embodiments of the present disclosure, an area of the first substrate and an area of the second substrate are formed to be different from each other so that radiant heat efficiency can be improved, thereby implementing a slimming structure of the thermoelectric module.

In particular, when the area of the first substrate is formed to be different from that of the second substrate, an area of the substrate on a hot side is largely formed so that a heat transfer rate can be improved and a heat sink can be removed, thereby implementing miniaturization and a slimming structure of a cooling device.

As previously described, in the detailed description of the disclosure, having described the detailed exemplary embodiments of the disclosure, it should be apparent that modifications and variations can be made by persons skilled without deviating from the spirit or scope of the disclosure. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims and their equivalents.

The present disclosure has been made keeping in mind the above problems, an aspect of embodiments of the present disclosure provides a thermoelectric module capable of preventing the leakage of a current generated from a connection portion upon connecting a thermoelectric semiconductor element to an electrode by forming an insulating layer having a low heat conductivity on an external surface of the thermoelectric semiconductor element and improving performance of the thermoelectric element by controlling a heat transfer phenomenon from a heating part to a cooling part.

According to an aspect of an embodiment of the present disclosure, there is provided a thermoelectric module including: a first substrate and a second substrate facing each other; a first semiconductor element and a second semiconductor element arranged between the first substrate and the second substrate; an insulating member disposed on an external surface of the first semiconductor element or the second semiconductor element and having a lower heat conductivity than that of the first semiconductor element or the second semiconductor element.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thermoelectric module, comprising:
a first substrate and a second substrate arranged to face each other;
a first semiconductor element and a second semiconductor element arranged between the first substrate and the second substrate;
a first insulating member disposed on an external surface of the first semiconductor element, and the first insulating member having a lower heat conductivity than the first semiconductor element; and
a second insulating member disposed on an external surface of the second semiconductor element, and the second insulating member having a lower heat conductivity than the second semiconductor element,
wherein the second insulating member is spaced apart from the first insulating member, and the first insulating member is composed of different material than the second insulating member.

2. The thermoelectric module of claim 1, wherein the first insulating member is disposed to be closely attached to the external surface of the first semiconductor element, and the second insulating member is disposed to be closely attached to the external surface of the second semiconductor element.

3. The thermoelectric module of claim 2, wherein the first insulating member is disposed to entirely surround the external surface of the first semiconductor element, and the second insulating member is disposed to entirely surround the external surface of the second semiconductor element.

4. The thermoelectric module of claim 3, wherein the first insulating member and the second insulating member are disposed to cover connection portions between the first and second substrates and the first and second semiconductor elements, respectively.

5. The thermoelectric module of claim 4, wherein the first insulating member and the second insulating member contain any one of an epoxy resin, an SiO-based material, an SiN-based material, an MgO-base material, and a CaO-based material, or a mixture of two or more materials selected from among these materials.

6. The thermoelectric module of claim 1, wherein the first substrate is a metal substrate, and the second substrate is a metal substrate.

7. The thermoelectric module of claim 6, wherein the metal substrate has a thickness ranging from 0.1 to 0.5 mm.

8. The thermoelectric module of claim 6, further comprising
a first dielectric layer on the first substrate, and
a second dielectric layer on the second substrate.

9. The thermoelectric module of claim 8, wherein the first dielectric layer has a thickness ranging from 0.01 to 0.1 mm.

10. The thermoelectric module of claim 8, further comprising
a first electrode layer disposed between the first substrate and the first dielectric layer, and
a second electrode layer disposed between the second substrate and the second dielectric layer.

11. The thermoelectric module of claim 10, wherein the first electrode layer electrically connects the first semiconductor element and the second semiconductor element and has a thickness ranging from 0.01 to 0.3 mm.

12. The thermoelectric module of claim 6, further comprising a diffusion prevention film at a portion where the first and second semiconductor elements and the first and second substrates are closely attached to each other.

13. The thermoelectric module of claim 1, wherein the first semiconductor element is a P type semiconductor element, and the second semiconductor element is an N type semiconductor element.

14. The thermoelectric module of claim 13, wherein a volume of the first substrate is different from a volume of the second substrate.

15. The thermoelectric module of claim 13, wherein a volume of the second semiconductor element is larger than a volume of the first semiconductor element.

16. The thermoelectric module of claim 14, wherein an area of the second substrate is larger than an area of the first substrate.

17. The thermoelectric module of claim 16, wherein the second substrate corresponds to a hot side.

18. A heat conversion device, comprising a thermoelectric module according to claim 1.

* * * * *